United States Patent [19]

Cook

[11] 4,149,302
[45] Apr. 17, 1979

[54] MONOLITHIC SEMICONDUCTOR INTEGRATED CIRCUIT FERROELECTRIC MEMORY DEVICE

[75] Inventor: Robert C. Cook, Palo Alto, Calif.

[73] Assignee: Ferrosil Corporation, Santa Clara, Calif.

[21] Appl. No.: 914,235

[22] Filed: Jun. 8, 1978

Related U.S. Application Data

[63] Continuation-in-part of Ser. No. 818,867, Jul. 25, 1977, abandoned.

[51] Int. Cl.² .............................................. H01G 7/00
[52] U.S. Cl. .................................... 29/25.42; 29/604; 29/628; 357/51
[58] Field of Search ...................... 29/25.42, 604, 625, 29/628; 357/51; 365/145, 149; 361/307, 313, 321; 427/126

[56] References Cited

U.S. PATENT DOCUMENTS

| | | | |
|---|---|---|---|
| 3,305,394 | 2/1967 | Kaiser et al. | 29/25.42 |
| 3,365,631 | 1/1968 | Delaney et al. | 361/321 |
| 3,405,440 | 10/1968 | Noltra et al. | 29/604 |
| 3,508,213 | 4/1970 | Hastings | 365/145 |
| 3,611,558 | 10/1971 | Carbonel | 29/604 |
| 3,623,030 | 11/1971 | Sawyer | 365/145 |
| 3,728,694 | 4/1973 | Rohrer | 361/321 |
| 3,864,817 | 2/1975 | Lapham, Jr. et al. | 29/577 |
| 3,886,582 | 5/1975 | Kobayashi | 357/22 |
| 3,939,292 | 2/1976 | Rohrer | 427/55 |

Primary Examiner—Lowell A. Larson
Attorney, Agent, or Firm—Limbach, Limbach & Sutton

[57] ABSTRACT

An improved monolithic semiconductor integrated circuit-ferroelectric device is disclosed together with the method of manufacturing the same. It was found that the preferred ferroelectric material, namely Phase III potassium nitrate, is extremely sensitive to moisture requiring unique processing steps to fabricate the structure. The process of manfacturing the monolithic structure is multi-stepped and is particularly adapted for fabricating a potassium nitrate ferroelectric memory on a semiconductor integrated circuit.

14 Claims, 10 Drawing Figures

MONOLITHIC SEMICONDUCTOR INTEGRATED CIRCUIT FERROELECTRIC MEMORY DEVICE

BACKGROUND OF THE INVENTION

This application is a continuation-in-part of U.S. Application Ser. No. 818,867, filed on July 25, 1977 now abandoned.

There have been recent breakthroughs in preparing ferroelectric devices comprising ferroelectric potassium nitrate. These devices are particularly useful as computer memory cells and preferably employ Phase III potassium nitrate in the ferroelectric phase which, in thin film form, is stable at ordinary room temperature and pressure. U.S. Pat. Nos. 3,728,694 and 3,939,292 disclose the preparation of such memory devices in detail and their teachings are incorporated herein by reference. Various ferroelectric materials have been studied for their information storage capability. Although many materials exhibit the ferroelectric phenomenon the predominant materials previously studied for memory application are barrium titanate, potassium dihydroxide phosphate, tri-glycerine sulfate and Phase III potassium nitrate. Phase III potassium nitrate exhibits a well defined critical switching threshold. Three conditions which must be fulfilled for a crystalline material to exhibit ferroelectricity are as follows:

1. It must have a phase transition from a polar to a non-polar structure, or at least must tend, with rising temperature, toward such a transition.
2. The polar phase must have a spontaneous polarization, that is, the unit cell must actually have a dipole moment, not only belong to a space group which is capable of such a moment.
3. The direction of the spontaneous polarization must be reversible by the applied electric field. This third condition is the most important.

The ferroelectric portion of the present invention is in the form of a capacitor memory cell. Geometrically, the memory cell is a capacitor with upper and lower metal electrodes sandwiching the ferroelectric material as the dielectric. As taught in U.S. Pat. No. 3,728,694, the ferroelectric material should be less than 110 microns and preferably have a thickness within the range from 100 Angstrom units to 15,000 Angstrom units. When the ferroelectric material is Phase III potassium nitrate, a thickness of less than 1 micron is preferred in order to achieve fast switching times. Fabricating multilayered devices such as these including metal layers are usually accomplished utilizing high vacuum deposition techniques.

The fabrication of semiconductor integrated circuits are well known and conventional. In the present invention, the term "semiconductor integrated circuit" is intended to include, inter alia, MOS and bipolar designs. The use of semiconductor integrated circuits fabricated with thin film ferroelectric memory devices in a monolithic structure requires the use of the unique processing steps which are the subject of the present invention. It was found that the ferroelectric memory layer, particularly Phase III potassium nitrate, is particularly sensitive to liquids such as water. This fact has lead to the need for development of a unique method of fabricating the semiconductor integrated circuit-ferroelectric layer in order to produce a structure which is of practical utility.

SUMMARY OF THE INVENTION

It has been found that if a semiconductor integrated circuit and ferroelectric device can be placed within a monolithic structure, several distinct and important advantages can be realized. Firstly, the space that the two devices occupy is considerably reduced. This can be very important when one considers the microprocessing applications that devices of the present invention are intended to satisfy. Secondly, it has been found that the speed of the monolithic structure is improved as compared to an individual semiconductor integrated circuit and a separate memory device in conventional form. This is particularly due to the relatively great distances which separate these individual devices in the prior art as compared to the size of the devices themselves and particularly the proximity which these devices occupy in a monolithic structure. Thirdly, the reliability problems are greatly reduced for whenever contacts and leads can be eliminated, the overall reliability of the system improves. Fourthly, a number of ferroelectric memory devices can be stacked in a single monolithic structure allowing for an expanded memory unit occupying extremely small space. Fifth, the cost of producing the monolithic structure is less than the fabrication costs of producing an individual semiconductor integrated circuit and separate ferroelectric chip for later connection.

The monolithic device of the present invention can be fabricated by stacking one or more ferroelectric memories on top of the semiconductor integrated circuit or the ferroelectric device can be placed on a chip surrounded by the semiconductor integrated circuit. Fabrication of both methods are quite similar and will be discussed together. The surface interconnects of the semiconductor integrated circuit can be used as a bottom electrode if the memory array occupies an area separate but on the same level as the integrated circuit. If the memory array is to be fabricated on top of the integrated circuit, the bottom electrode would be separate and insulated from the interconnects. In other words, if the monolithic device is to have the form of a ferroelectric memory unit surrounded by a semiconductor integrated circuit, the interconnects can function as the bottom electrode. In the form of a "stacked" monolithic structure, the bottom electrode of the ferroelectric member must be separate and distinct from the conductive interconnects of the integrated circuit.

Once the interconnects are formed, a non-semiconductor dielectric layer is placed thereon through which interconnect and bonding pads are formed. The interconnect pads will be used to functionally connect the electrodes of the ferroelectric device to predetermined points on the surface of the integrated circuit. The bonding pads will later be used to connect other areas of the integrated circuit to external sources the nature of which will depend upon the ultimate use of the present device. The non-semiconductor dielectric can be such things as CVD (chemical vapor deposition) glass or silicon nitride. CVD glass can be deposited on the semiconductor body without appreciably raising the temperature of the semiconductor to form significant silicon dioxide on the body. The low temperature glass can be grown by low temperature passivation techniques at temperatures which are normally below 400° to 900° C. Other techniques used to grow a layer of silicon dioxide or silicon nitride are by vapor deposition, epitaxial techniques to form epitaxial reaction glasses, anodic oxidation and high vacuum deposition of insulating materials such as sputtered quartz. Some of these techniques are described in detail in U.S. Pat. No. 3,886,582.

Again, by use of standard photoresist techniques, the bottom electrode can be formed. Like the interconnects, which can be the bottom electrode in a non-stacking type of device, the bottom electrode can be metal such as aluminum, silver and gold or other conducting materials such as doped polysilicon or doped single crystal silicon. Co-pending application Ser. No. 887,115 discloses unique electrode materials particularly adapted for use in structures described herein. Once the bottom electrodes are configured, an optional, second, non-semiconductor is applied uniformly over the first or bottom electrode. The non-semiconductor dielectric, such as CVD glass or silicon nitride, is then etched at certain selective spots called vias which are the predetermined areas of contact between the bottom and top electrodes which sandwich the ferroelectric layer. The second non-semiconductor dielectric layer can be eliminated if the top and bottom electrodes are of chemically dissimilar material such that the step of configuring the top electrode will not adversely affect the bottom electrode.

At this point, the ferroelectric material is applied. As stated previously, this material is preferably Phase III potassium nitrate which can be formed by, for example, sputtering or evaporating, under vacuum, $KNO_3$ (preferably reagent or ultrapure grade), and collecting the vapors as a crystalline thin film. The formation of the ferroelectric layer is gone into in great detail in U.S. Pat. No. 3,728,694.

If one attempts at this point to simply configure a top electrode, certain processing difficulties arise. It is desirable to contain all of the $KNO_3$ within the confines of the top electrode to protect the $KNO_3$ from contact with the environment which, particularly under high humidity conditions, can greatly and adversely affect the performance of the $KNO_3$. Fine line etching of the $KNO_3$ requires photoresist techniques which, in turn, requires etchants which are high in moisture content. Thus, special processing techniques have been developed in order to maintain the ferroelectric material below and confined by the top electrode material.

Once the $KNO_3$ layer is formed over the bottom electrode non-semiconductor dielectric layer, a uniform layer of protective metal is applied. The protective metal can be composed of the same materials which make up the top and bottom electrodes or can be a material such as that disclosed in co-pending application Ser. No. 887,115, filed on Feb. 13, 1978. Once the ferroelectric material is uniformly coated with the protective metal, the protective metal-ferroelectric material can be etched by standard photoresist techniques resulting in a well defined pattern of ferroelectric material having a protective metal coating thereon. The photoresist can then be removed by well known techniques. Removal of the photoresist at this stage does not adversely affect the ferroelectric material because of the protective metal layer. The top electrode can then be applied by uniformly depositing a conductive layer (a metal or doped polysilicon) and configured to cover, in image-wise configuration, the ferroelectric material-protective metal layer. These processing technqiues will be gone into in greater detail in describing the figures appended to the present application.

Once the top electrode is formed, the entire surface of the device can be covered with a non-semiconductor dielectric such as CVD glass or silicon nitride to aid in protecting any exposed regions of the ferroelectric material. As stated previously, the ferroelectric material is extremely moisture sensitive although, at this stage, it has been protected by the use of the protective metal layer and the top electrode. Thus, the use of the top insulating passivation layer can be eliminated if desired. This is particularly true if there is little chance of exposing the monolithic structure to an environment having a relatively high humidity. If the passivation is, in fact, employed as a final step in the processing, this layer is etched from around the bonding and contacting pads and a conductor such as metal or doped polysilicon can be injected into these areas for contacting the top electrode through the connecting pads to predetermined spots on the semiconductor integrated circuit and for filing the bonding pads to provide external electrical contacts to other sources.

Turning now to the figures.

Figure 1:
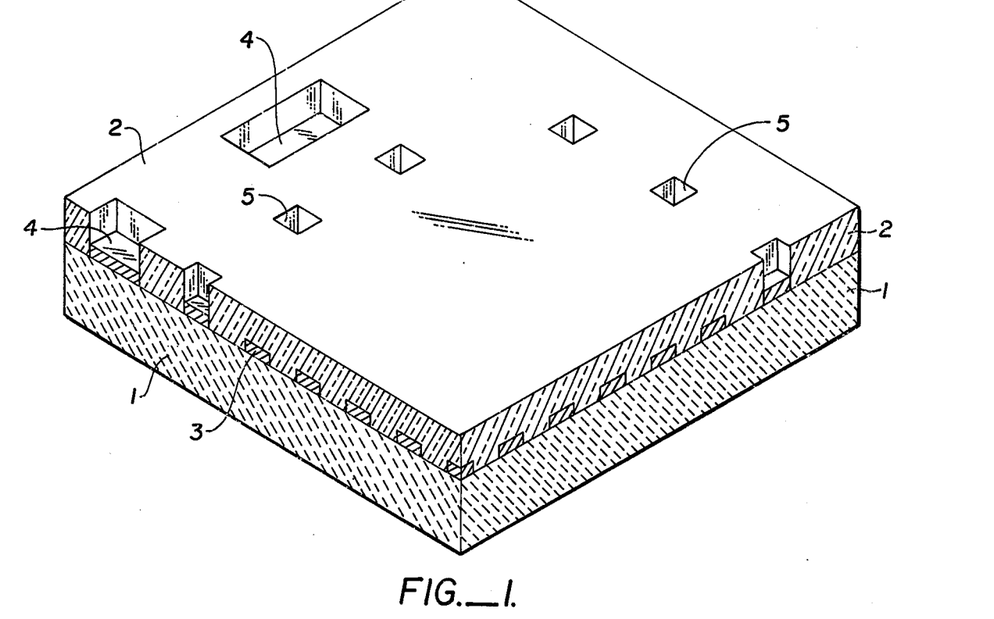
FIGS. 1–9 represent structures of the present invention in various stages of completion.

Turning now to FIG. 1, semiconductor integrated circuit 1 is shown with interconnects 3 and non-semiconductor dielectric 2. The interconnects can comprise any acceptable conductive material such as doped polysilicon or a metal such as gold, silver or aluminum. The interconnects can be formed by standard photoresist techniques notoriously well-known in the art. Upon the interconnects is placed a non-semiconductor dielectric 2 such as CVD glass or silicon nitride. The dielectric layer is intended to insulatively separate the interconnects from the bottom electrode of the ferroelectric device.

Once non-semiconductor dielectric layer 2 is uniformly applied to semiconductor integrated circuit 1 and interconnects 3, bonding pad holes 4 and contact pad holes 5 are formed. Again, these can be fabricated by employing standard photoresist techniques. The bonding pads 4 are intended to supply contact areas wherein the semiconductor integrated circuit could be functionally connected to external elements while the contact pads 5 are intended to provide functional connections between the ferroelectric device and the semiconductor integrated circuit.

Figure 2:
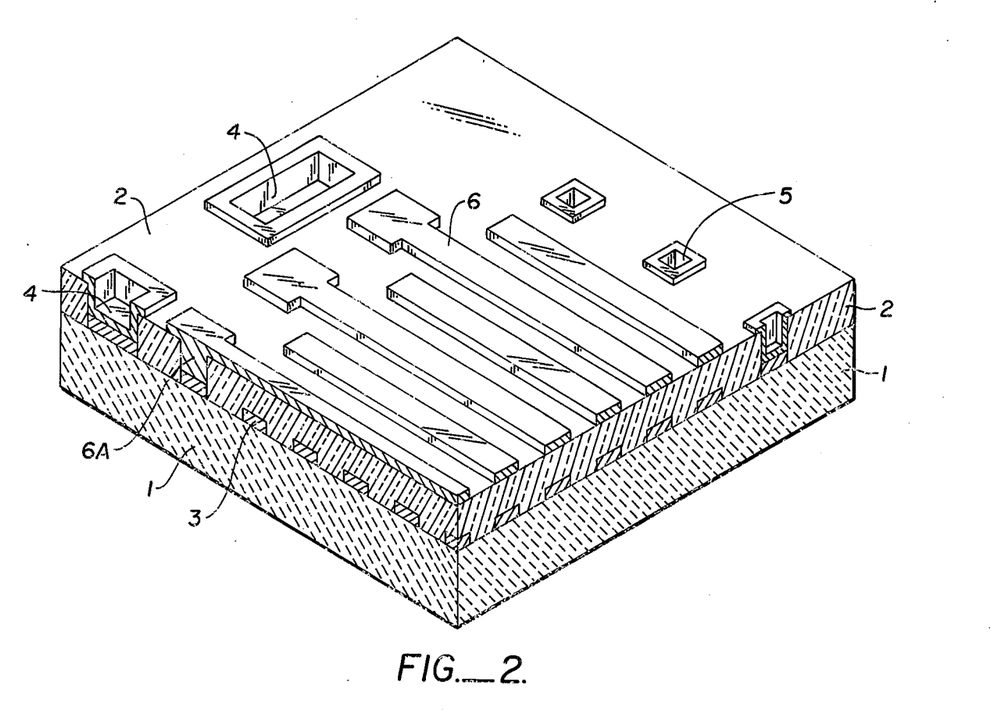

Referring to FIG. 2, after application of non-semiconductor dielectric layer 2, the bottom electrode 6 of the ferroelectric device can then be formed. As in the fabrication of interconnects 3, bottom electrode 6 can be formed by standard photoresist techniques. For example, a metal layer can be uniformly applied to non-semiconductor dielectric layer 2 by vacuum deposition whereupon a polymerizable plastic is applied which is polymerized in image-wise configuration and washed away in non-polymerized areas. The conductive layer is then etched away in non-protected areas forming electrodes 6. At the same time, contact pads 6A can be filled with conductive material in order to functionally connect bottom electrode 6 to semiconductor integrated circuit 1. As an alternative, electrodes 6 can be connected to the integrated circuit at 6A later with conductive material 13,14.

Figure 3:
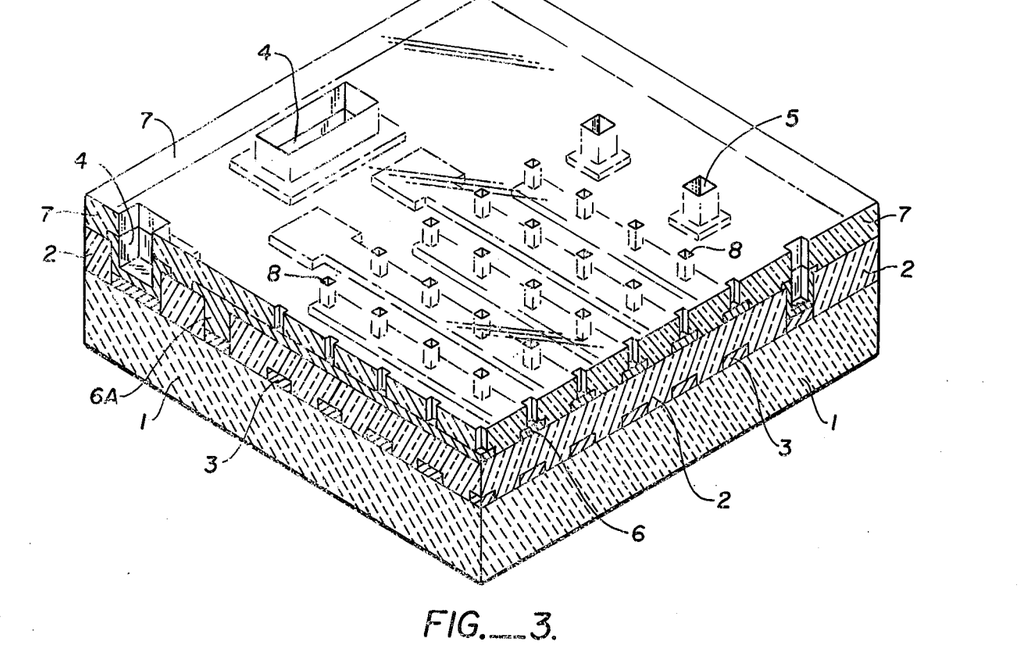

Turning now to FIG. 3, a second non-semiconductor dielectric layer 7 is optionally applied over bottom electrode 6–6A. Because functional contact must be maintained between bottom electrode 6 and the later applied top electrode 11 through ferroelectric layer 9, vias 4, 5 and 8 are cut into non-semiconductor dielectric layer 7 at the interconnect points between the bottom and top electrodes. Although the use of the second non-semiconductor dielectric is optional, it generally provides for less critical processing tolerances and improved electrical performance. As in the bottom non-semiconductor dielectric layer, the upper layer 7 can be composed of CVD glass, silicon nitride or any other appropriate non-semiconductor dielectric material and the vias can be formed, again, by standard photoresist techniques.

At this point, the heart of the ferroelectric device is formed, ferroelectric layer 9. This material is vacuum deposited as a thin film over bottom electrode 6 and non-semiconductor dielectric 7 and is preferably composed of Phase III potassium nitrate which is stable at ordinary room temperature. Alternatively, this layer can be formed by sputtering in a vacuum. Although not absolutely necessary, the dielectric can be cooled in a predetermined gas, such as nitrogen, without quenching. Care must be taken to prevent moisture from contacting the ferroelectric layer as moisture could destroy its ferroelectric properties.

Various ferroelectric materials have been studied for their information storage capability. Although many materials exhibit the ferroelectric phenomenon, the predominant materials previously studied from memory application are barium titanate, potassium dihydrogen phosphate, tri-glycerin sulfate, and Phase III potassium nitrate. Phase III potassium nitrate exhibits a well-defined critical switching threshold and is therefore a preferred ferroelectric material. If potassium nitrate is chosen as as ferroelectric material, a preferred layer thickness is found to be from 100 Angstrom units to 25,000 Angstrom units and, within that range, it has been found that optimum results are achieved when the thickness of Phase III potassium nitrate which is stable at standard temperature and pressure has a thickness of less than 2 microns.

Figure 4:
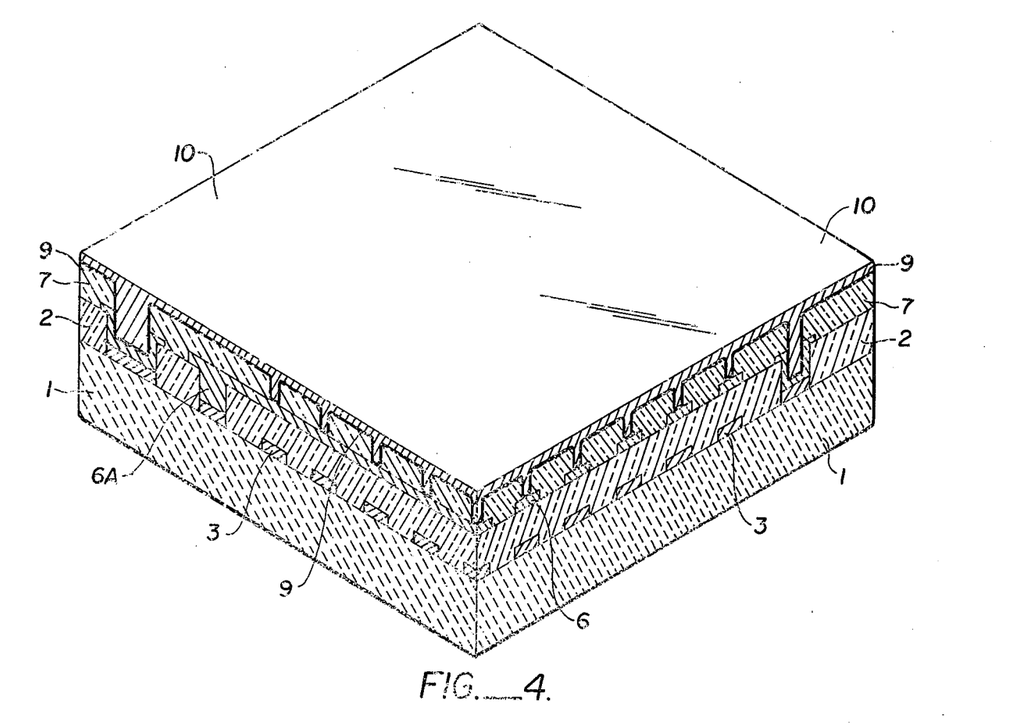

Referring to FIG. 4, the ferroelectric layer 9 is uniformly applied to non-semiconductor dielectric layer 7. The ferroelectric material uniformly coates the non-semiconductor dielectric and fills the vias and thus contacts selected portions of bottom electrode 6. On top of ferroelectric layer 9 is placed protective metal layer 10 by any of the variously well-known standard techniques. For example, conductive layer 10 can comprise a metal such as gold, silver or aluminum or doped polysilicon and can be applied to ferroelectric layer 9 by vacuum deposition or sputtering. Also, materials as shown in co-pending application Ser. No. 877,115 can be employed which will improve the longevity of the memory device.

As stated previously, it is the primary object of the present invention to contain the ferroelectric layer completely below and protected by the top electrode. If the ferroelectric material is allowed to uniformly rest over the entire surface of the bottom electrode-non-semiconductor dielectric layers, moisture can contact the ferroelectric material which will virtually destroy its usefulness as a memory material.

The uniformly applied ferroelectric layer 9 is thus coated with protective metal layer 10. On top of metal layer 10 is coated photoresist layer 11 which is exposed in image-wise configuration to harden the photoresist in a pattern which will form the final desired pattern of the protective metal layer. The photoresist can then be washed away in non-hardened areas. This wash away step will not adversely affect the Phase III potassium nitrate layer due to the existence of protective metal layer 10. The hardened photoresist and unprotected metal layer 10 and ferroelectric layer 9 can then be removed by well-known techniques such as by sputter etching or ion milling.

Figure 5:
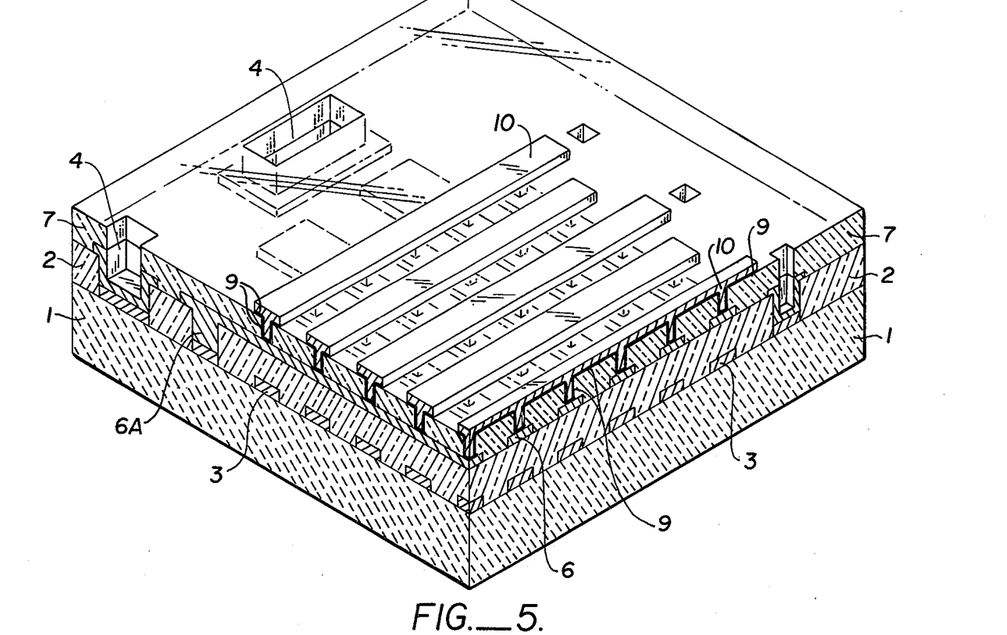

FIG. 5 shows a configuration wherein the ferroelectric layer 9 and protective metal layer 10 have been configured to substantially conform to the later applied top electrode. It is only necessary that the $KNO_3$ and protective metal layers remain at the intersect points between the top and bottom electrodes. Thus, the $KNO_3$ and protective metal layers can be etched away everywhere but at vias 8 (FIG. 3) in practicing the present invention. The embodiment shown in FIG. 5 wherein the ferroelectric layers 9 and protective metal layer 10 are configured to substantially conform to the later applied top electrode is but one possible configuration of the present invention.

Figure 6:
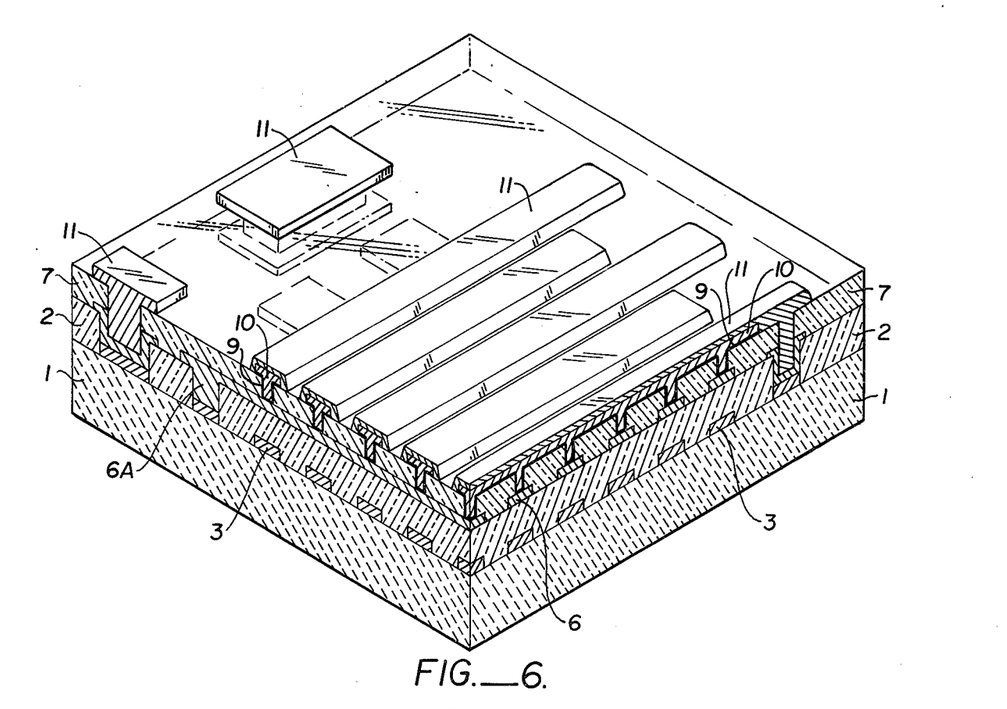

Referring to FIG. 6, top electrode 11 can be configured into its final form by first applying a uniform conductive layer and selectively etching away unwanted areas. This can be done in the same pump down operation that is used to sputter etch or ion mill the excess ferroelectric layer, protective metal layer and photoresist to produce the structure shown in FIG. 5. Standard photoresist techniques can be employed to form top electrode 11 only by practicing the present invention. Normally, if standard photoresist techniques are employed, the acid used to etch the top conductive layer to form electrodes 11 will undoubtedly adversely affect ferroelectric layer 9 due to the water content of etching solution. Regardless of the care taken in isolating the ferroelectric materials from the etching solutions, the ferroelectric layer will be at least partially destroyed by the moisture. It was found that by using protective metal layer 10, standard photoresist techniques could be used to form top electrode 11 including the use of acid based etching solutions, although protective metal layer 10 still performs a protective function if electrodes 11 are formed by ion milling or sputter etching; the later techniques resulting in higher manufacturing yields.

As seen by viewing FIG. 6, top electrode metal is used to fill vias 5 and bonding pad holes 4. It is necessary to provide contact between top electrodes 11 and the integrated circuit. This can conveniently be accomplished at this stage by merely extending electrodes 11 through vias 5.

Figure 7:
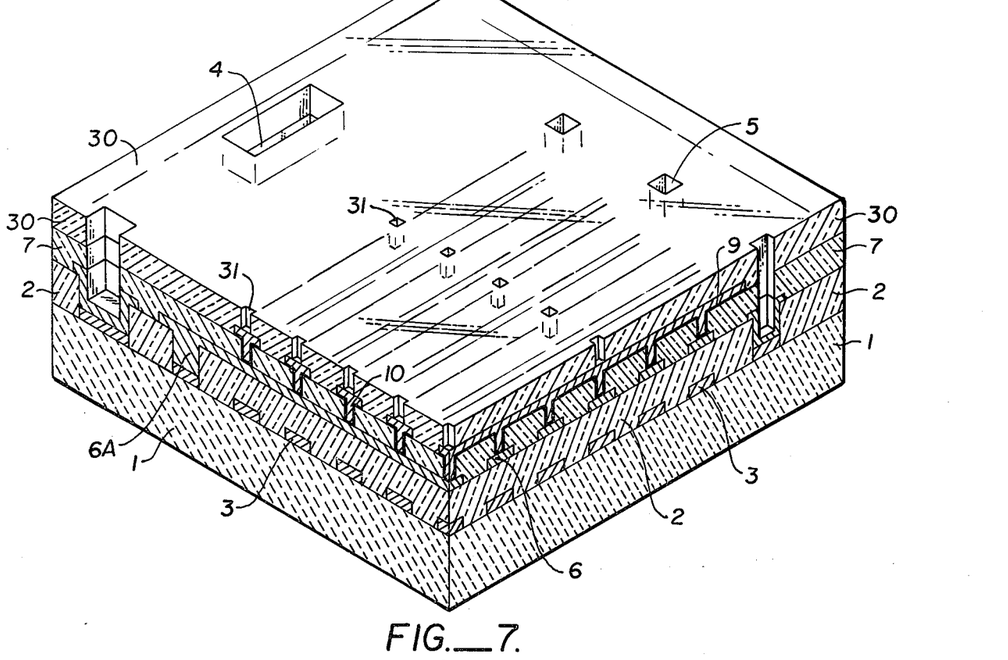

An alternative means of preparing the ferroelectric structure for application of top electrode 11 is shown in FIG. 7. In this embodiment, ferroelectric layer 9 and protective metal layer 10 are formed as described previously. Instead of immediately adding a top conductive layer to form electrodes 11, a non-conductive dielectric layer 30 is applied and vias 31 are cut therein which form the contact points between electrodes 11 and protective metal 10. The vias can be formed by standard photoresist techniques. This alternative embodiment offers the advantage of further isolating ferroelectric layer 9 from the processing steps used in fabricating top electrode 11. It should be noted that if the ferroelectric-protective metal layers are configured to reside only at vias 8, it would be necessary to use vias 31 at each point that discontinuous layers 9 and 10 reside. In the configuration shown in FIGS. 7, 8 wherein layers 9, 10 are continuous bars which parallel top electrode 11, only one row of vias 31 are needed to achieve electrical contact.

Figure 8:
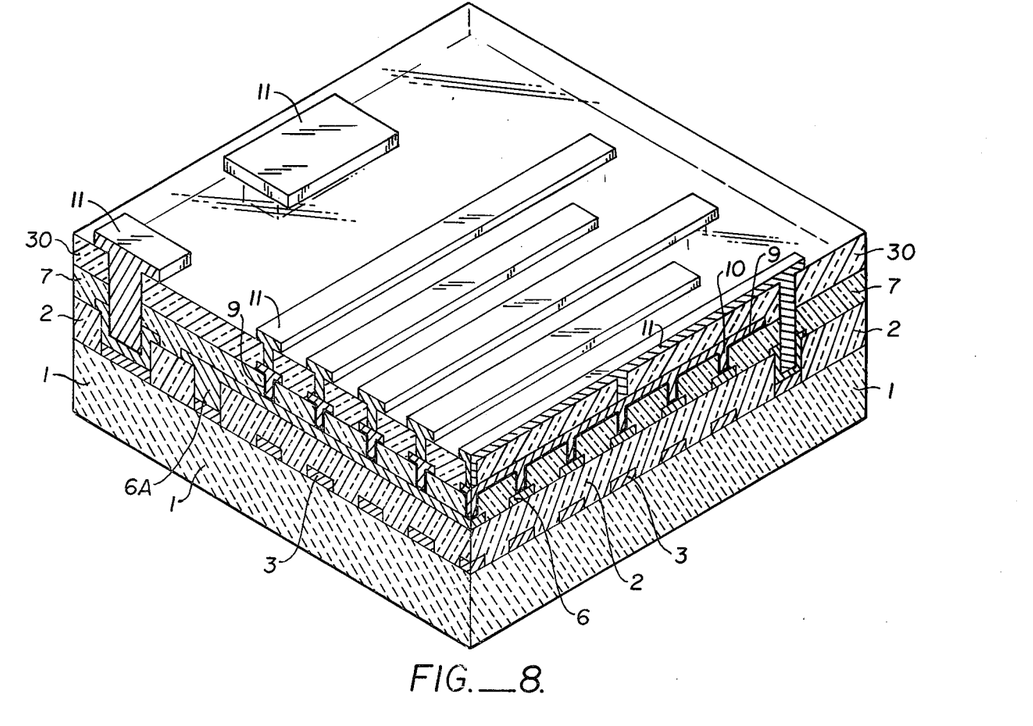

The structure of FIG. 8 is shown with top electrode layer 11 formed thereon. The top electrode layer is formed in an identical manner as that described previously; i.e. by applying a uniform conductive layer, adding a photoresist, image-wise hardenings of photoresist, removing the unhardened photoresist and supporting metal via sputter etching, ion milling or acid etching in image-wise configuration and finally removing the hardened photoresist by any well-known technique.

Figure 9:
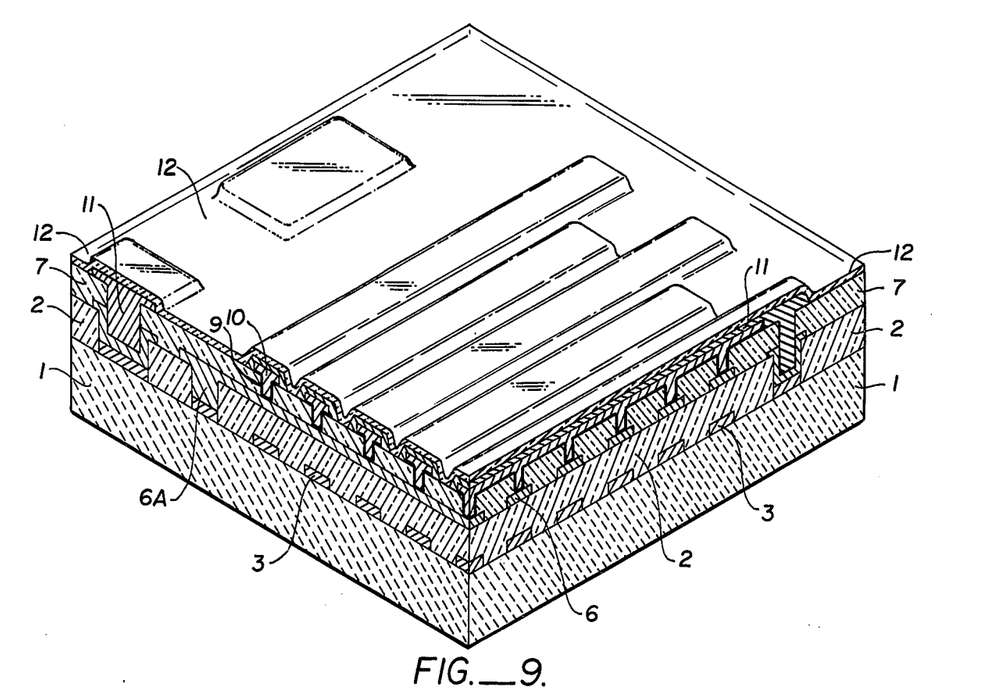

Once the top electrode layer is formed, the entire structure can be covered with a top passivation layer such as passivation glass or silicon nitride to prevent moisture contamination of the ferroelectric layer. The use of protective metal layer 10 and overlying top electrode 11 act as excellent protection for the ferroelectric material. However, if the structure of the present invention is to be used in the presence of high humidity, passivation layer 12 adds further protection for if the ferroelectric layer is Phase III potassium nitrate, the material reverts to another phase and loses its ferroelectric properties in the presence of moisture. In any event, top passivation layer 12 shown in FIG. 9 is optional and can be eliminated. The bonding pads 4 have previously been described as being filled with metal when the electrodes 11 were made. If, however, this were not done, it could be done at this time after first etching the passivation glass layer 12. If so, layer 12 need only be etched over metal 11 to provide for electrical contact between the semiconductor integrated chip and external access sources at this time.

The monolithic semiconductor integrated circuit-ferroelectric device is particularly adapted for use in binary systems, i.e., computers and the like, and processes therefor. It was discovered that the ferroelectric devices of the present invention produce an unexpected result in their failure to exhibit a "waiting" effect, a distinct advantage over prior art ferroelectric devices. The unobvious result achieved was attributable to the formation of a crystalline thin film of Phase III potassium nitrate, since similar devices prepared from "bulk" Phase III potassium nitrate exhibit a "waiting time" and are unstable under ambient conditions, i.e., room temperature and pressure over an extended period of time.

FIGS. 1-9 deal with the fabrication of a monolithic semiconductor integrated circuit-ferroelectric memory device wherein the memory device is stacked directly upon the semiconductor integrated circuit interconnects. As stated previously, several ferroelectric memory devices may be "stacked" on an IC device and such a configuration is considered part of the present invention.

Figure 10:
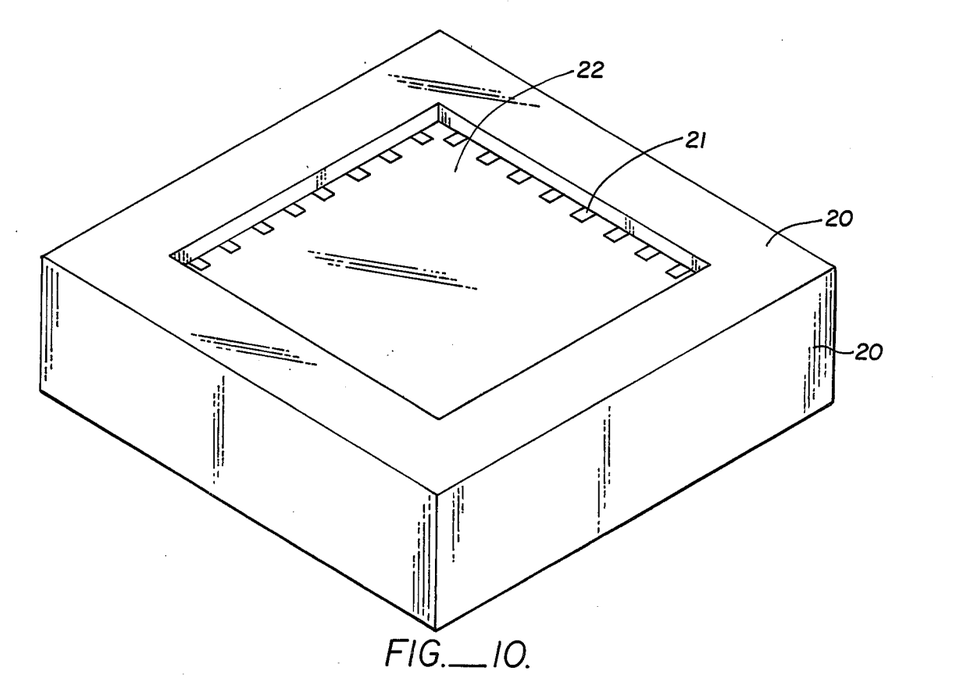
FIG. 10 shows a semiconductor integrated circuit chip for accepting a ferroelectric device within the logic circuitry rather than on top of it.

FIG. 10 shows a semiconductor integrated circuit which has been adapted to accept a ferroelectric device where this device is within and surrounded by the interconnects of the semiconductor integrated circuit, rather than being located on top of these elements.

More specifically, the decode integrated circuit logic is contained in area 20 and the interconnects are polytabs or another electrically conductive material emanating from this logic circuit and extending to inner surface 22 at points 21. Surface 22 is flat and is usually composed of $SiO_2$. Fabrication of the ferroelectric device within areas 22 parallels the processing steps outlined in FIGS. 1-8. The only difference is that the bottom and top electrodes of the ferroelectric device are connected to predetermined polytabs at the periphery of the ferroelectric device rather than to interconnects below the ferroelectric device of the previous embodiment. The only substantive difference in the process steps would be in the elimination of the need for insulating the bottom electrode from the interconnects, i.e., the elimination of layer 2 in FIG. 1. Other than that, the steps are identical.

The crux of the present invention is the formation of a memory structure wherein the top electrode acts to overlap and protect the ferroelectric layer. Without using the protective metal layer of the present invention, the structure could only be fabricated by applying the top electrode layer over the ferroelectric layer and etching both layers simultaneously. This prevents the possibility of any overlap between the top electrode and ferroelectric layers which results in exposure of the ferroelectric material to moisture contamination. Photoresist cannot be directly applied to the preferred ferroelectric material, Phase III potassium nitrate. Thus, without using the protective metal layer, photoresist can only be added on top of electrode 11 resulting in the etching of electrode 11 and the Phase III potassium nitrate in one step. Referring to FIG. 6, the present invention provides for a top electrode 11 which not only resides on top of the Phase III potassium nitrate but also overlaps and covers the side walls of the ferroelectric material.

While the present invention has been particularly shown and described with reference to preferred embodiments, it will be understood by those in the art the changes and modifications in form and details may be made without departing from the spirit and scope of the present invention.

What is claimed is:

1. A method of fabricating a monolithic semiconductor integrated circuit and ferroelectric memory device comprising:
   A. forming first layer interconnects on the surface of a semiconductor integrated circuit;
   B. depositing a non-semiconductor dielectric and forming interconnect and bonding pad vias therein;
   C. depositing a conductive layer and forming a bottom electrode;
   D. applying a ferroelectric layer;
   E. applying a conductive layer over the ferroelectric layer;
   F. removing the conductive layer and the ferroelectric layer in selected areas; and
   G. depositing another conductive layer and forming a top electrode.

2. The method of claim 1 wherein said ferroelectric layer substantially comprises Phase III potassium nitrate.

3. The method of claim 1 wherein said first layer interconnects are composed of doped polysilicon.

4. The method of claim 1 wherein said non-semiconductor dielectric is selected from the group consisting of low temperature glass, silicon nitride, and sputtered and evaporated dielectrics.

5. The method of claim 1 wherein said first layer interconnects are composed of a metal.

6. The method of claim 2 wherein said Phase III potassium nitrate layer has a thickness within a range of from 100 angstrom units to 25,000 angstrom units.

7. The method of claim 2 wherein said Phase III potassium nitrate layer has a thickness of less than 2 micron and is stable at room temperature.

8. A method of fabricating a monolithic semiconductor integrated circuit and ferroelectric memory device comprising:
- A. forming first layer interconnects on the surface of a semiconductor integrated circuit;
- B. depositing a non-semiconductor dielectric and cutting interconnect and bonding pad vias therein;
- C. depositing a conductive layer and forming a bottom electrode;
- D. depositing a second non-semiconductive dielectric and forming vias therein;
- E. applying a ferroelectric layer;
- F. applying a conductive layer over the ferroelectric layer;
- G. applying a photoresist over the conductive layer;
- H. removing the photoresist, conductive layer and ferroelectric layer in selected areas;
- I. removing the remaining photoresist to expose the remaining conductive layer; and
- J. depositing another conductive layer and forming a top electrode.

9. The method of claim 8 wherein the photoresist is hardened in image-wise configuration in areas over the vias formed in the second dielectric layer.

10. The method of claim 9 wherein the non-hardened photoresist and the conductive layer and ferroelectric layer located below the non-hardened photoresist are removed by a process selected from the group consisting of sputter etching, ion milling and plasma etching.

11. The method of claim 8 wherein a non-semiconductor dielectric layer is uniformily deposited over the top electrode.

12. The method of claim 8 wherein said ferroelectric layer substantially comprises a Phase III potassium nitrate.

13. The method of claims 1 or 8 wherein conductive material is applied to the bonding and interconnect pads.

14. A method of fabricating a monolithic semiconductor integrated circuit and ferroelectric memory device comprising:
- A. forming first layer interconnects on the surface of a semiconductor integrated circuit;
- B. depositing a non-semiconductor dielectric and cutting interconnect and bonding pad vias therein;
- C. depositing a conductive layer and forming a bottom electrode;
- D. depositing a second non-semiconductive dielectric and forming vias therein;
- E. applying a ferroelectric layer;
- F. applying a conductive layer over the ferroelectric layer;
- G. applying a photoresist over the conductive layer;
- H. removing the photoresist, conductive layer and ferroelectric layer in selected areas;
- I. removing the remaining photoresist to expose the remaining conductive layer;
- J. applying a third non-semiconductive dielectric layer and forming vias over the exposed conductive layer; and
- K. depositing another conductive layer and forming a top electrode.

* * * * *